US008329573B2

(12) United States Patent
Viswanadam

(10) Patent No.: US 8,329,573 B2
(45) Date of Patent: Dec. 11, 2012

(54) WAFER LEVEL INTEGRATION MODULE HAVING CONTROLLED RESISTIVITY INTERCONNECTS

(76) Inventor: Gautham Viswanadam, Singapore (SG)

( * ) Notice: Subject to any disclaimer, the term of this patent is extended or adjusted under 35 U.S.C. 154(b) by 0 days.

(21) Appl. No.: 13/180,691

(22) Filed: Jul. 12, 2011

(65) Prior Publication Data
US 2011/0318852 A1 Dec. 29, 2011

Related U.S. Application Data

(63) Continuation-in-part of application No. 12/991,545, filed as application No. PCT/SG2009/000164 on May 6, 2009, now Pat. No. 7,998,854.

(30) Foreign Application Priority Data

May 6, 2008 (SG) ............................. 200803479-5

(51) Int. Cl.
*H01L 21/4763* (2006.01)
(52) U.S. Cl. ................... 438/618; 257/E21.531
(58) Field of Classification Search ............ 438/18, 438/113, 618; 257/48, E21.531, E23.002
See application file for complete search history.

(56) References Cited

U.S. PATENT DOCUMENTS

| 6,846,736 | B2 * | 1/2005 | Ireland ............................. | 438/618 |
|---|---|---|---|---|
| 7,557,014 | B2 | 7/2009 | Okamoto et al. | |
| 7,799,602 | B2 | 9/2010 | Pagaila et al. | |
| 2002/0047210 | A1 | 4/2002 | Yamada | |
| 2005/0233572 | A1 * | 10/2005 | Su et al. ........................... | 438/618 |
| 2006/0223301 | A1 * | 10/2006 | Vanhaelemeersch et al. | 438/618 |
| 2006/0281295 | A1 | 12/2006 | Naujok et al. | |
| 2009/0081862 | A1 * | 3/2009 | Chen et al. ...................... | 438/618 |
| 2010/0314777 | A1 | 12/2010 | Oda | |

FOREIGN PATENT DOCUMENTS

| EP | 238 089 A2 | 9/1987 |
|---|---|---|
| WO | 03/065 450 A2 | 8/2003 |

OTHER PUBLICATIONS

P.S. Andry, et al;"A CMOS-Compatible Process for Fabricating Electrical Through-vias in Silicon", 2006 Electronic Components and Technology Conference; pp. 831-837; IBM T.J. Watson Research Center; Yorktown Heights, NY IBM Systems and Technology Group; Essex Junction, VT.

* cited by examiner

*Primary Examiner* — Thao Le
(74) *Attorney, Agent, or Firm* — Jacobson Holman PLLC

(57) ABSTRACT

A wafer level integration module and method for fabricating are disclosed according to a construction whereby semiconductor functional device fabrication is carried out only after interconnect structures are processed on a bare wafer. The fabrication and processing include forming interconnect structures in a first side of a wafer. An insulation layer is deposited on the first side of the wafer. A conductive layer is deposited on the insulation layer so as to fill the interconnect structures and contact the insulation layer on the walls thereof. The conductive layer on the interconnect structures forms interconnection contacts on the first side of the wafer and interconnection vias extending into the wafer. The conductive layer including the interconnection contacts is exposed on the first side of the wafer. A semiconductor functional device is fabricated on the first side of the wafer and interconnected with the interconnection contacts during the fabricating. Portions of the first conductive layer associated with the interconnection vias are exposed from the second side of the wafer. A portion of the first conductive layer can be selectively removed to form interconnection via redistribution connection structures that can be filled with a low resistivity material to form low resistivity redistribution interconnect with the semiconductor functional device through the first conductive layer.

19 Claims, 7 Drawing Sheets

WAFER LEVEL INTEGRATION MODULE HAVING CONTROLLED RESISTIVITY INTERCONNECTS

CROSS-REFERENCE TO RELATED APPLICATIONS

The present application is a Continuation-in-part of U.S. patent application Ser. No. 12/991,545 entitled "WAFER LEVEL INTEGRATION MODULE WITH INTERCONNECTS" filed on Nov. 8, 2010, now U.S. Pat. No. 7,998,854 which is a National Stage Application of International Application PCT/SG2009/000164 filed on 6 May 2009 (Publication No. WO 2009/136873), which claims priority to Singapore Application No. 200803479-5, filed 6 May 2008 by Viswanadam, all of which are incorporated herein by reference.

FIELD OF THE INVENTION

The present disclosure relates generally to an architecture for an integrated circuit (IC) device and a method of manufacturing the same. More particularly, the present disclosure relates to an architecture for IC device that provides preformed wafer level interconnect structures having controlled resistivity.

BACKGROUND OF THE INVENTION

As the degree of integration of integrated circuit devices continues to increase and the size and scale of devices correspondingly decreases, devices become more delicate in structure and more susceptible to damage during manufacturing. It is a well known problem that as wafer scales decrease in size, circuit yields in terms of the number of usable dies per wafer correspondingly decrease due to various problems associated with the quality of the silicon substrate, the level of cleanliness in the processing plant and other factors. Meanwhile, demand for higher yields resulting from economic pressure is increasing.

One particularly troublesome yield-impacting problem is associated with the bonding of the finished die to a packaging substrate. Such a packaging substrate allows interconnects to be made between the product, represented as a raw die, and an external bonding pad, chip carrier, wire bond, or the like, such that the die or chip can be converted into a useful package that can be soldered or otherwise fixed onto a circuit board, or into a circuit or device.

In a typical post device fabrication process, an interconnect structure is etched during a backside process to form interconnections to the device from the backside such that metal or doped polysilicon can be used to make a connection between the device and the packaging. Disadvantages associated with the conventional processing become immediately apparent in the form of potential damage to the device by, inter alia, the heat associated with the etching and control factors leading to etching beyond the interconnect channel boundary and into the device, and other anomalies. In response to such challenges, some techniques have been proposed that involve various approaches to minimize the contact with delicate device structures once they are in place.

For example, in the above-identified International Application No. PCT/SG2009/000164, an architecture is disclosed wherein interconnect structures are formed on a front side of a wafer before a device is fabricated. The structures are filled with a polysilicon, portions of which are exposed during a backside process such as chemical mechanical polishing or the like. It can be appreciated that the polysilicon structures may have disadvantages in connection with certain applications in that the resistivity of the doped polysilicon can be difficult to control leading to uneven and generally higher resistivity. Such higher resistivity is undesirable for use with certain kinds of lines including power lines, lines having a relatively long span, high frequency lines or other critical signal lines or the like. While Viswanadam teaches that a metal layer may be applied during front side processing while the interconnect structures are formed, there may be limitations associated with such structures formed from a front side process. It is known that differences in the respective coefficients of thermal expansion for a metal structure as compared to a silicon or polysilicon structure can cause problems such as cracking during thermal cycles, which can lead to device failure.

Consequently, in view of the above described and other disadvantages, it has become desirable to successfully perform processing to form interconnect structures such as through vias while overcoming the problems of the art. Examples of conventional processing include the formation of annular metal through vias and the like as described in greater detail herein below. For example, with reference to FIG. 1A, a series of steps associated with the formation of an annular metal through via, such as that described in "A CMOS-compatible Process for Fabricating Electrical Through-vias in Silicon" by P. S. Andry, et al., 2006 Electronic Components and Technology Conference, pp. 832 (hereinafter "Andry"), is shown. It is important to note that in Andry, an annular metal through via is formed by front side fill processing. After front side etching of an annular cylindrical shape to constitute the via, a thermally grown oxide can be used for insulation. After etching, a conductive material is deposited so as to completely fill the insulated via. The conductive materials described in Andry include Cu formed by electrodeposition and tungsten formed by CVD. The wafer can then be thinned and back side processed to expose the vias. It should be noted that the annular conductor via structure benefits from, for example, a silicon core thermal expansion coefficient-matched with the metal and thus results in improved mechanical performance.

In FIG. 1B, a variant described in Andry is shown that includes a core conductor process whereby the annular cylinder is insulated with a thermal grown oxide as described herein above. However, rather than being filled with metal, the annular cylinder is filled with undoped polysilicon and polished and devices and other structures can be added in a manner similar to more conventional processes where vias are added in a final step. The wafer is thinned, and back side patterned. The silicon core is then etched away and replaced with a partial skin of electroplated copper.

In still another conventional process, as described in "High Density Through Wafer Via Technology" by Tomas Bauer, NSTI-Nanotech 2007, Vol. 3, 2007 (www.nsti.org, ISBN 1420061844), pp. 116-119 (hereinafter "Bauer"), a via "plug" can be formed in a low resistivity silicon wafer by laterally isolating a section of the wafer by forming a narrow closed loop trench, on the order of 10 μm to 15 μm, and filling the trench with an isolating material. The resulting isolated plug is then used as the via. A deep reactive ion etching (DRIE) process can be used for trench formation as illustrated in FIG. 10. Various problems arise in connection with plug formation. For example, such a process can be intrinsically wasteful in that the low resistivity material is generally more expensive than insulating material; the unused portion of the low resistivity substrate not used for the via may be considered waste unless used for other conducting applications.

Further, it is well appreciated in the art that DRIE processes are relatively expensive compared to other etching processes such as wet etching or the like. Therefore, the necessity of using a DRIE process is more expensive and still further gives rise to the possibility that the plug will become unseated if the etch is too deep resulting in lower yields. Still further, it is not clear whether the scale of the process shown in 1C is reducible to higher or lower scales without additional difficulties.

Such conventional methods are disadvantageous in that they involve front side processing which complicates device formation and attachment; are typically more expensive due to the requirement for more critical processing; and still do not provide for a high degree of control of the resistivity of the via depending on the application. Therefore, there is a need for a method of providing interconnect structures that allows for controlled resistivity, particularly low resistivity.

SUMMARY OF THE INVENTION

An aspect provides a method of fabricating a wafer level integration module with interconnects comprising providing a wafer having a first side and a second side; forming depressions in the first side of the wafer; depositing a first insulation layer on the first side of the wafer; depositing a first conductive layer on the insulation layer, the first conductive layer having a first side and a second side; depositing a second insulation layer on the first side of the conductive layer; exposing the first conductive layer; fabricating a semiconductor functional device on the first side of the wafer; exposing from the second side of the wafer, the second side of the first conductive layer; depositing a third insulation layer on the exposed second side of the first conductive layer; patterning the third insulation layer and exposing portions of the first conductive layer; depositing a second conductive layer on the patterned third insulation layer; and exposing second layer conductive layer for contact with external devices.

In an embodiment the depressions form microstructures. The conductive layer is a high temperature conductive film. The conductive interconnect film may be exposed by chemical mechanical polishing. A substrate may be provided and attached to the first side of conductive interconnect film to protect the first side of the wafer. A conductive material may be deposited to the second layer conductive layer for contact with external devices.

In an embodiment the semiconductor functional device may comprise depositing additional layers forming the functional device. The additional layers may form a plurality of functional devices. The additional layers may be formed in a stack formation. The plurality of dies may be formed on the wafer. The dies may be separated along separation zones the plurality of dies. The functional device may be a transistor and the plurality of functional devices may be transistors.

In an embodiment the functionality of the semiconductor device may be tested after fabrication of the device tested. The testing of the semiconductor device comprises forming test pads on the first side of the wafer. The test pads may be removed after testing and before fabrication of a subsequent device. A fourth insulation layer may be deposited to protect the second conductive layer.

BRIEF DESCRIPTION OF THE DRAWINGS

In order that embodiments may be fully and more clearly understood by way of non-limitative example from the following description taken in conjunction with the accompanying drawings in which like reference numerals designate similar or corresponding elements, regions and portions, and in which.

DETAILED DESCRIPTION OF THE INVENTION

According to various embodiments, an architecture and corresponding methods are discussed and described whereby an integrated circuit (IC) device can be provided with an interconnect structure can be formed during a front side process, a device can be formed on the front side and controlled resistivity interconnects can be provided during back side processing. In particular, low resistivity interconnects can be formed by removal of polysilicon deposited during front side processing and replaced with low resistivity metal or controlled resistivity material such as polysilicon doped to a more advantageous degree than that deposited during front side processing.

Figure 1A:
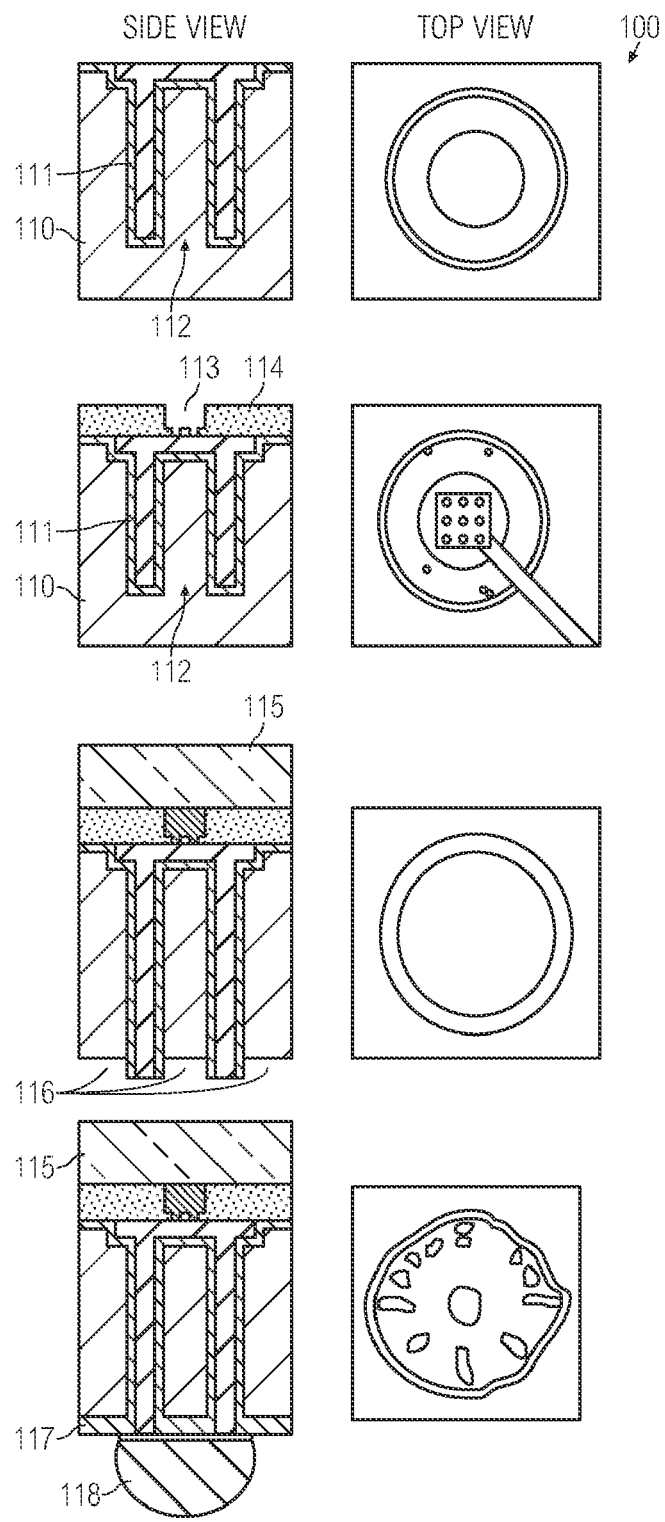
FIG. 1A is a diagram illustrating portions of a prior art process for front side filling of an annular through via.

As described hereinabove, prior art approaches, such as Andry and Bauer, have limitations in that the processing for the vias can be complicated and expensive, and may not provide desired yield. With more specific reference to FIG. 1A, a silicon wafer 110 can be configured with through vias for interconnection by forming annular via structures. The vias are thereafter formed in two primary ways, with the via conductor formed in the annular ring itself or within the core defined by the annular ring. In one example shown in FIG. 1A, an annular via structure 111 can be etched into wafer 110 with a core section 112 remaining within the annulus. The annular structure 111, can then be insulated and metal filled, after which wiring levels 113 and 114 can be built, vias can be exposed, a glass handler 115 attached and backside processing 116 conducted. Finally, an insulation layer 117 can be provided and a ball limited metallization layer can be formed and controlled collapse chip connection (C4) solder ball 118 can placed for forming electrical interconnections. As in connection with prior art methods such as the above described methods, processing for metal filling is conducted on the front side after which the process is fixed. It will be appreciated that it can be advantageous in accordance with embodiments described herein, to use certain polysilicon materials to fill interconnection structures during front side processing such as in connection with interconnect structure and device fabrication and perform additional interconnect processing during backside processing, such as removal of the polysilicon materials and replacement with controlled resistivity metals including low resistivity metals. Doing so can improve various factors during fabrication, as the polysilicon may exhibit material properties advantageous during processing but later become disadvantageous for final device purposes.

Figure 1B:
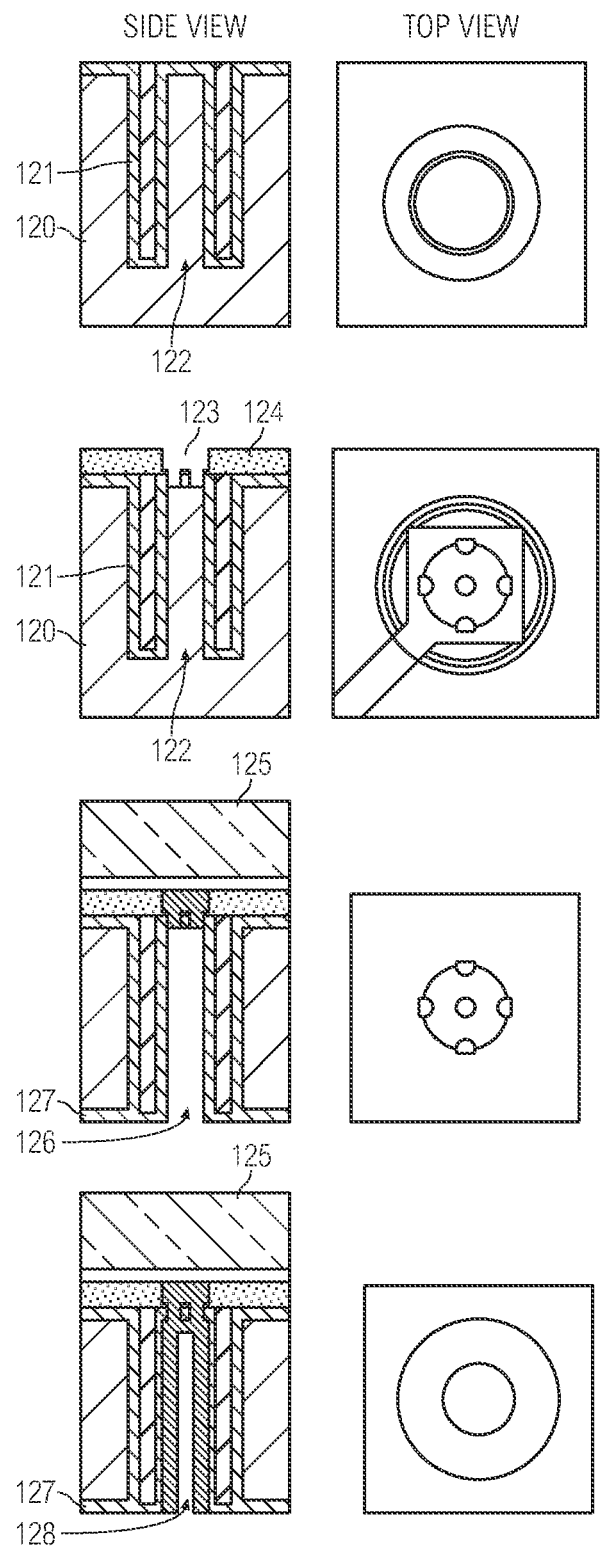
FIG. 1B is a diagram illustrating portions of a prior art process for front side partial filling of an annular through via.

In an alternative conventional approach, with reference to FIG. 1B, a wafer 120 can be etched as described above using for example DRIE processing to form an annular trench 121. The trench can be insulated and filled with polysilicon. After further front side processing to form, for example, wiring levels 123 and 124, the annular trench can be exposed and the silicon material from wafer 120 can be removed to form a core area 126. After an insulation layer 127 is provide, the core area can be fully or partially filled with metal 128 and a BLM and C4 attachment process conducted (not shown), for example, as described hereinabove.

Figure 1C:
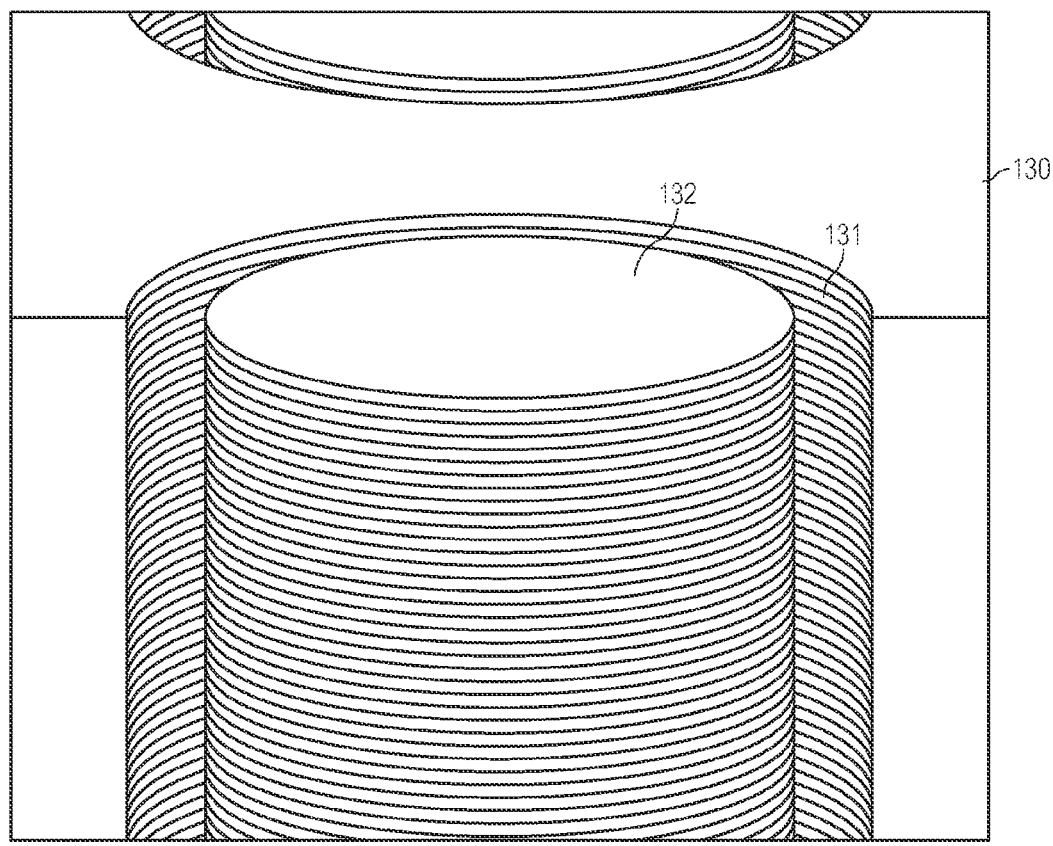
FIG. 1C is a diagram illustrating a prior art front side etching process to create an annular channel.

It should be noted that the use of DRIE processing to form an annular trench is shown in greater detail in FIG. 1C. It will be appreciated that the processing to form the annular trench can itself give rise to difficulties. Generally, a silicon wafer 130, or wafer 110 or 120) can be etched using DRIE to form an annular trench 131, which effectively forms an isolated plug 132. Depending on the depth requirements for the via, the etching depth can vary. Problems can arise however in that the structural integrity of the plug can fail and the plug can become loosened before trench filling can be accomplished. Such problems can ultimately lead to yield reduction and the like.

The above described and other problems can be resolved in accordance with embodiments as discussed and described herein. Accordingly, as set forth variously in FIG. 2A-2F, to be described in greater detail hereinafter, a wafer 10 having a first or top surface, such as surface 12, and a second or bottom surface, such as surface 14, and can be provided as, for example, a blank polished or unpolished silicon wafer 10 or the like. High aspect ratio micro-structures 16 specifically configured to provide a die level interconnect configuration and mapping, are provided on the first blank surface 12 of the wafer, for example, during front side processing. After addition of passivation layer 18, the wafer 10 can be passed to subsequent device processing steps with pre-formed conductive interconnect microstructures 16 in place. During device fabrication, for example, at the wafer fabrication facilities, front side 12 devices are fabricated, the silicon material 20 is then removed from a second side 14 of the device wafer 10, opposite the first side, to expose the high temperature conductive interconnect microstructures 16 and to remove the material from the structures and replace the removed material with a controlled resistivity material, such as a low resistivity doped material, metal or the like.

Once the microstructures have been filled with controlled resistivity materials, contacts can be formed on the second side 14 of the wafer 10 using, for example, conductive metal such as during a BLM and C4 process as described above. Because of the formation of the microstructures and filling the microstructures with polysilicon material and removal and replacement of the polysilicon material with controlled resistivity materials, the contacts can be conveniently electrically connected through the microstructures to the functional device 26. It will be appreciated that in various embodiments, a predetermined I/O pad distribution on the raw silicon wafer 10 prior to the device fabrication process can be established in connection with embodiments described herein. A high temperature conductive interconnect film is deposited on a raw silicon wafer 10 with necessary dielectric insulation components to prevent electrical current leakage and circuit shorting to silicon substrate in use. Once the interconnections are made, the device under application is fabricated and the wafer 10 further processed for interconnecting the same to the external printed circuit board where the packaging interconnections are pre-formed on the blank wafer first prior to packaging.

Figure 2A:
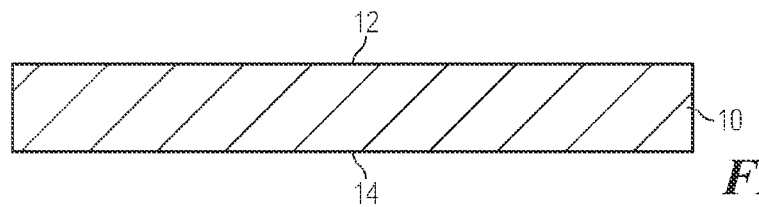
FIGS. 2A-2J are diagrams illustrating cross-sectional views of an exemplary wafer during various processing steps in accordance with the formation of wafer level interconnects.
Figure 2B:
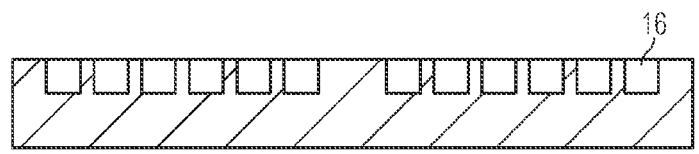

With reference to FIG. 2A-2M, a cross-sectional view of a silicon wafer, such as wafer 10, during processing steps of fabricating a functional IC device thereon and removal of polysilicon and replacement of removed polysilicon with controlled resistivity material such as low resistivity metal or the like, in accordance with embodiments are shown. FIG. 2A is a schematic cross section of a blank silicon wafer 12, which may be polished, unpolished, P-type, N-type, having a desired orientation for each application, or the like. It will be appreciated that other wafers would be suitable, such as for example a galium arsenide wafer, gallium indium wafer, germanium wafer, and the like. FIG. 2B shows the wafer 12 with microstructures 16 formed for the purpose of providing interconnections for the device under fabrication. The microstructures 16 may have a dimension suitable for the specific application, for example, the microstructures may have an opening (X,Y) geometry of 0.5 μm (micron), and a depth of 10 μm (micron). The dimensions of the microstructures can be established, for example, so as to be a minimum size, or can be established to be a particular size, in accordance with embodiments depending on factors such as device size and spacing of interconnection points. The microstructures may be formed using, for example, etching, or any other silicon removal method known in the art.

Figure 2C:
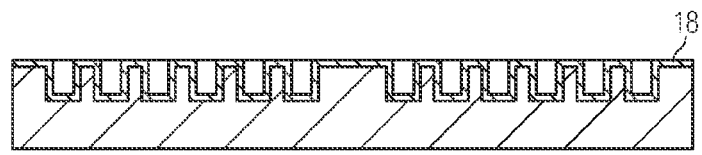
Figure 2D:
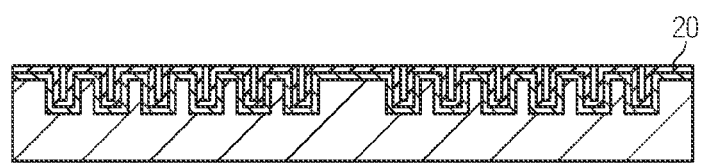

FIG. 2C shows the wafer with insulated, passivation layer 18. The passivation layer 18 may be a material such as SiO2, SiN, or the like. The passivation layer on the microstructures can be applied, for example, so as to isolate the silicon walls of the microstructures from the materials associated with, for example, the conductive interconnect film 20 shown in FIG. 2D. The deposition of the passivation/insulation materials associated with passivation layer 18 may be performed using known deposition processes. The wafer may be deposited with a conductive interconnect film 20 such as a high temperature interconnect film or material, or the like deposited at the microstructure walls for the purpose of providing interconnections with device under fabrication. Conductive films or materials used for interconnect film 20 can be deposited using methods known in the art. Doped conductive polysilicon or the like may be used as a material to provide a degree of electrical conductivity, however as noted, the degree of conductivity may not be as easy to control, or alternatively, there may be a use for one conductivity level for use during manufacturing that can relatively easily be provided by the polysilicon material. In practice however, the polysilicon material may be insufficient for precise application, such as a high speed signal application, a critical radio frequency connection, a power connection, or the like, where a level of precision associated with the resistivity level of the interconnection is crucial or can significantly improve the performance associated with the interconnection.

Figure 2E:
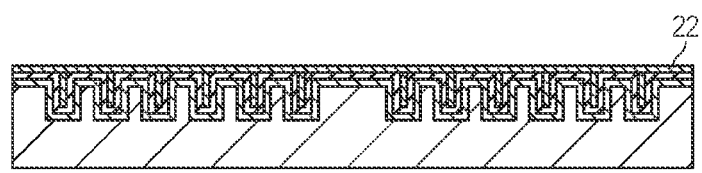

In FIG. 2E, the wafer 10 is shown with a final passivation or insulation layer 22 deposited to protect the conductive interconnect films at the microstructures pre-formed for the purpose of interconnections with device under fabrication. The passivation layer 22 may be a material such as SiO2, SiN, or the like. It will be appreciated that in an embodiment, such as is shown, the final passivation layer can protect the layer immediately thereunder and can provide additional protection to underlying structures that may be positioned deeper.

However, in other embodiments, since an oxide may form naturally over the polysilicon without any additional steps which acts to protect, the deposition of the passivation layer 22 may not be necessary.

Figure 2F:
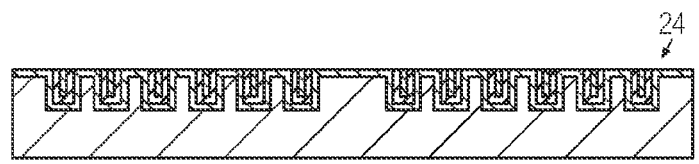

FIG. 2F shows the processed wafer 24 after the removal of excess passivation films or materials 22 and excess conductive films or materials 20 deposited on the first side of the blank wafer 10 to expose the high temperature conductive interconnect film microstructures. The excess films or materials are removed by processes known in the art.

Figure 2G:
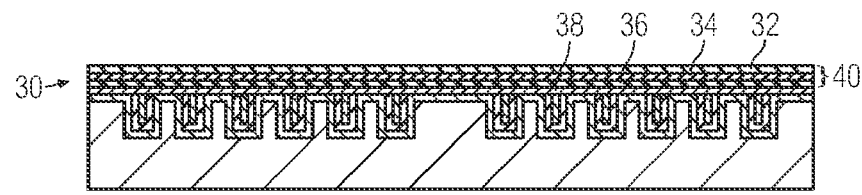
Figure 2H:
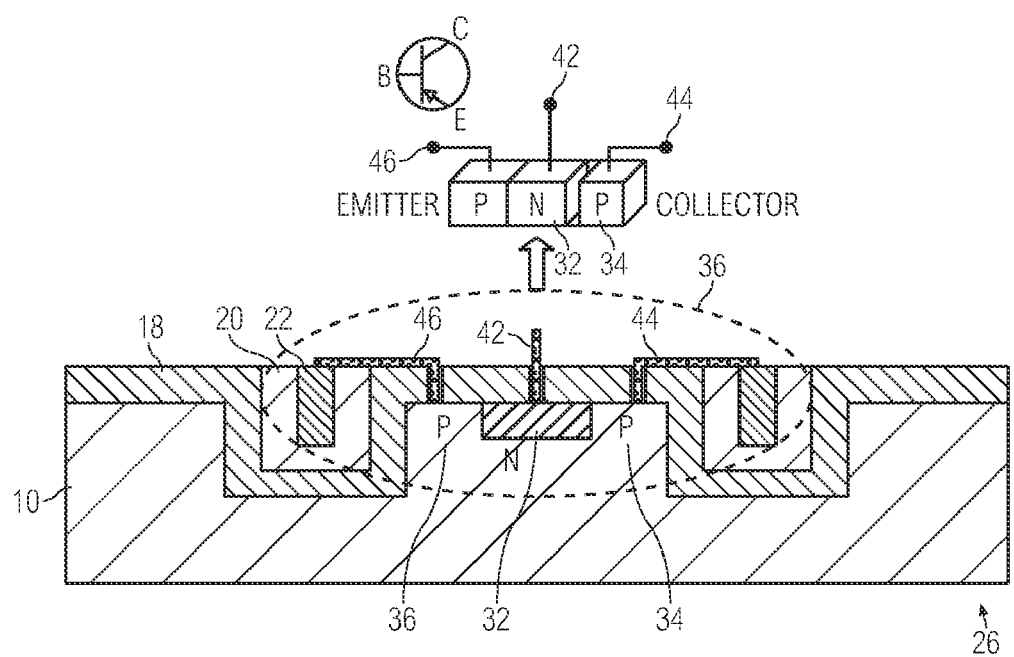
Figure 2H:
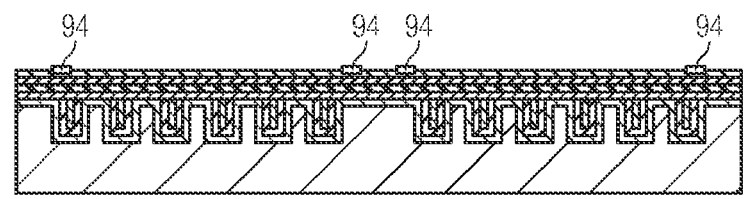

FIG. 2G shows the processed structure 30 after at least one functional device is fabricated on wafer 10 in the form of, for example, layers 40. In the illustrated embodiment, the functional device shown can be a transistor. However it will be appreciated that the functional device may be configured differently and take different forms. For example the functional device may include transistors, resistors, capacitors, inductors, micro electro mechanical systems (MEMS), surface acoustic wave (SAW) devices, or the like. The layers 40 of the functional device are fabricated over the pre-formed microstructures 24. The number of layers, for example layers 38,36,34,32 shown for the device example, depend on the type of device fabricated and the particular device design and in accordance with process guide lines. For example, the transistor devices are internally interconnected with the interconnection contacts located at the pre-formed microstructures of the wafers. The transistor device fabrication may be carried out at the wafer and device fabrication facilities. FIG. 2H shows test pads 94 formed on the front side of the wafer. The functionality of the fabricated device may be tested by providing corresponding test pads 94 on the front side of the wafers. The test pads may be metal and formed in conventional manner. In an embodiment, after testing the functionality of the device, the test pads may be removed, in particular if another device is to be fabricated on top of the tested device, since the metal of the test pads may not withstand the high temperatures in the fabrication process of the next device.

Figure 2I:
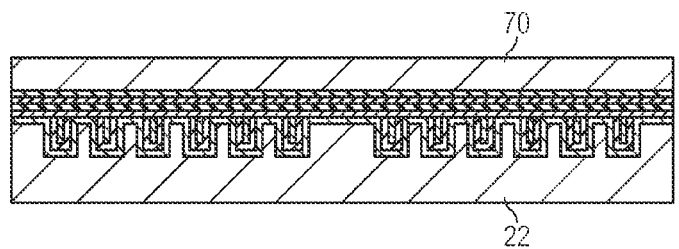

FIG. 2I shows an example of a processed wafer 10 attached with another substrate 70 on the front side of the silicon wafer to cover the functional device. The substrate 70 protects the functional device that has been fabricated on the front side from possible damage associated with handling, environment, and other hazards that may damage the functional device. The substrate 70 can be formed of silicon, ceramic, glass, plastic molded or can be any substrate suitable for use in semiconductor device applications.

Figure 2J:
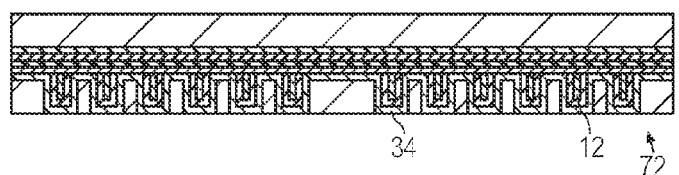
Figure 2K:
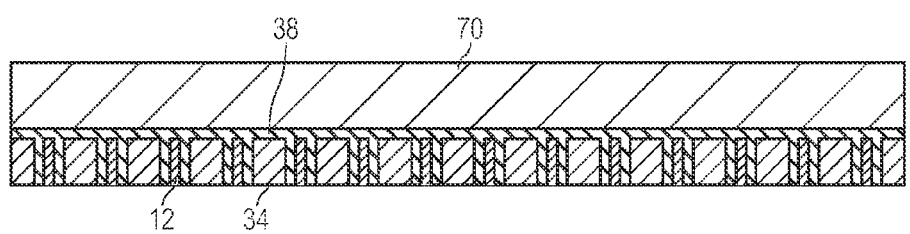
FIG. 2K is a diagram illustrating a cross-sectional view of an exemplary wafer prior to removal of material from interconnect structure in accordance with an embodiment.

FIG. 2J shows the processed silicon wafer after the removal of excess silicon materials from the second side of the wafer, to expose the insulation or passivation films, such as passivation layer 18 deposited at the pre-formed microstructures on the front side of the wafer. The passivation film material exposed may be $SiO_2$, SiN, or the like as discussed. The silicon removal processes is any suitable process well known in the art. In FIG. 2K, in a alternative or in-line processing step to the processing described in parent application Ser. No. 12/991,545, the silicon wafer may be optionally or additionally processed, on the second side thereof to expose interconnect structures 16 filled with, for example, doped or undoped polysilicon material 12. A handling layer 70 can be put in place to protect a device layer 38, whereupon the material between the interconnect structures 16 can be, for example, bulk silicon 34, as described hereinabove and can further be insulated from the polysilicon interconnect structures 16 through an insulation layer. The second surface of the wafer can be exposed by grinding etching or the like as will be appreciated in a manner sufficient to expose the interconnect structures such that further processing may be conducted.

Figure 2L:
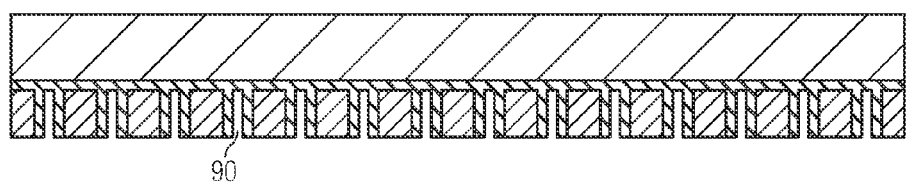
FIG. 2L is a diagram illustrating a cross-sectional view of an exemplary wafer after removal of material from interconnect structure in accordance with an embodiment.
Figure 2M:
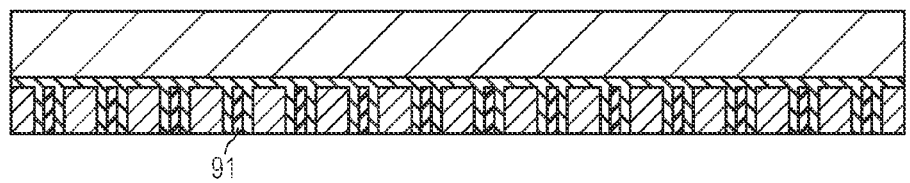
FIG. 2M is a diagram illustrating a cross-sectional view of an exemplary wafer after removal of material from interconnect structure and replacement with controlled resistivity material in accordance with an embodiment.

In FIG. 2L it can be seen that the processed wafer, after grinding or etching to remove the bulk silicon, can be subjected to a process to remove the doped or undoped polysilicon material 12 in the interconnect structures. Subsequently, as shown in FIG. 2M, the voids left after removal of the polysilicon material 12, can be filled with a material having controlled resistivity, such as a low resistivity metal or the like that particularly suits the final application for the device.

Figure 3:
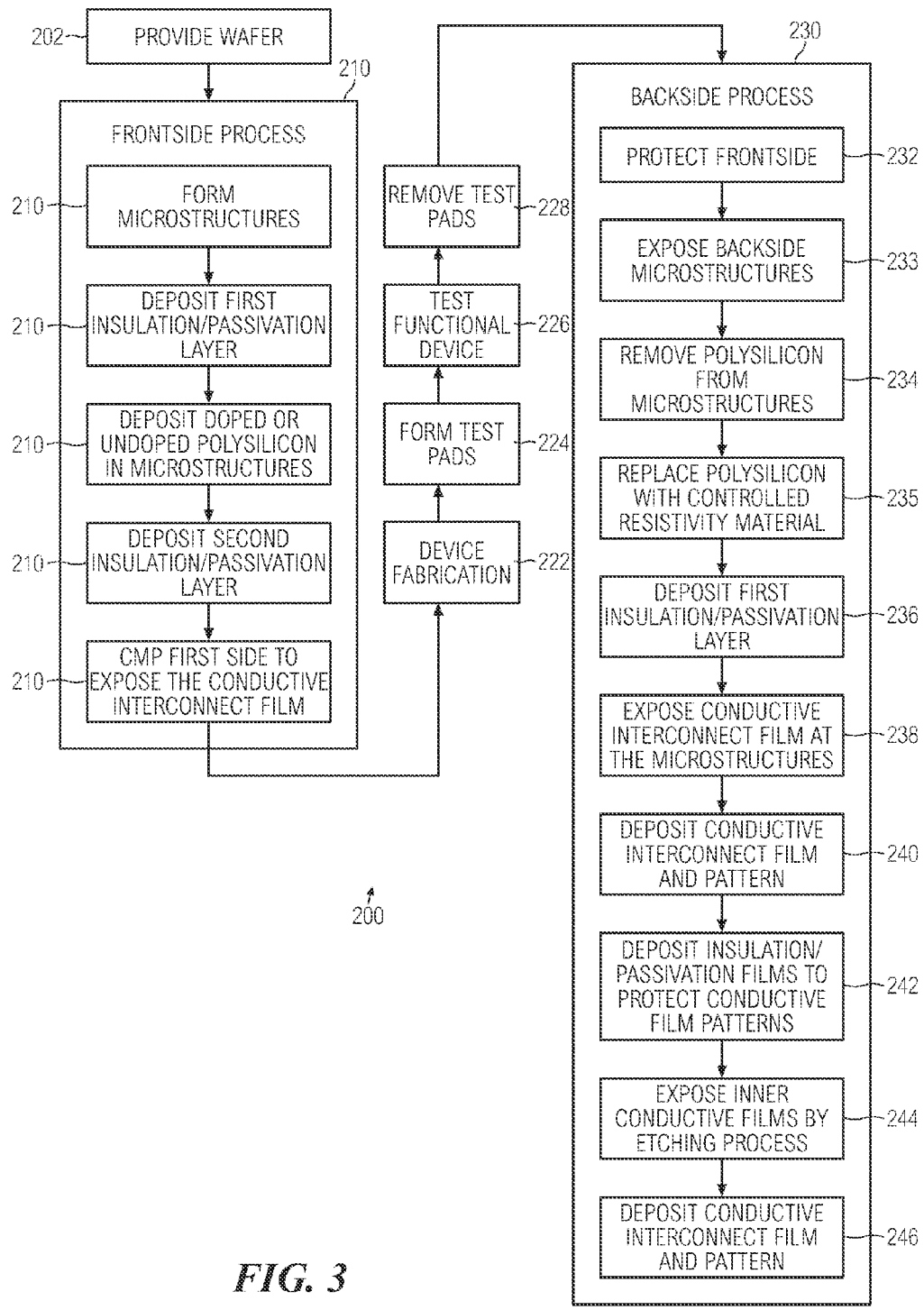
FIG. 3 is a flow chart illustrating exemplary processing steps associated with removal of material and replacement with controlled resistivity material in accordance with an embodiment.

It will be appreciated that in accordance with embodiments, the invention can be practiced as a method for fabricating a wafer level interconnect structure as illustrated in FIG. 3. In accordance with the exemplary method 200, after a wafer is provided at 202, a frontside process 210 can be commenced, where microstructures such as microstructures 16, as interconnect structures can be formed at 212. An insulation/passivation layer can be deposited at 214, whereupon after masking/exposing the microstructures on the front side, doped or undoped polysilicon can be deposited at 216. Additional insulation passivation layers can be added at 218, whereupon the interconnects can be exposed at 220.

After frontside processing to create the interconnects and fill them as described, a device or devices can be fabricated at 222, test pads can be formed at 224, functional device test can be performed at 226, and test pads removed at 228. After testing is complete, backside processing can be conducted at 230. It will be appreciated that it may be advantageous to conduct testing activities using synthetic signals of a different current or power level than may be optimal for the device during use. Such alternate signal testing may be further facilitated using the doped or undoped polysilicon filled in microstructures 16. After the frontside is protected at 232, the interconnect structures can be exposed by backside processing at 233 such as by grinding chemical etching or the like as it commonly practiced. The doped or undoped polysilicon can be advantageously removed at 234 and replaced with a controlled resistivity material such as a low resistivity metal or the like at 235. It will be appreciated that, for example, a low resistivity metal will allow signals at full current levels to be handled by the device. By applying synthetic or test signals to confirm that no short or misdirected circuits are present using the doped or undoped polysilicon interconnects, damage to the device can be avoided. If such currents are applied to a defective device, further damage could be caused, for example, to adjacent devices further lowering yield.

Once the interconnect structures are filled with the low resistivity material, an insulation/passivation layer can be deposited at 236, and further steps can be conducted such as exposing the newly filled interconnect microstructures at 238, depositing further conductive interconnect patterns at 240, further insulation passivation layers at 242, exposing the interconnect patterns at 244, depositing further interconnect patterns at 246, and so on.

Embodiments virtually eliminate the packaging and assembly activities for the devices as the interconnections are carried out prior to the device fabrication during the wafer fabrication process at the wafer fabs. Embodiments offer advantages such as elimination of the requirement of bond pads at the peripheral of the devices. This gives rise to reduced silicon area and more functionality on a given silicon size, thus reducing the silicon cost. Another advantage is that circuitry for interconnection of the IOs with in the chip is minimized, which improves speed of the device and contributes to minimizing in interconnect routing noise. This contributes to the overall improvement on performance of the devices. Additionally, since no packaging such as die bonding, wire bonding, and the like is required, the cost on packaging is completely eliminated. As the I/O are predetermined before the devices are fabricated, there is no limitation on the I/O pitch with in the chip and hence high density interconnect chips can be fabricated using this process. An embodiment allows all the primary interconnections and test pads to be located within the chip without running any interconnect lines to device peripherals. Since no peripheral bond pads are involved in embodiments, the scribe lines can be minimized, such as for example down to as small as 20 to 30 micron, which will allow additional silicon for additional device accommodation, thus further reducing the cost of silicon per device. The resulting reduction in street between the devices fits well into the existing laser dicing processes with optimal silicon scribe areas.

While embodiments have been described and illustrated, it will be understood by those skilled in the technology concerned that many variations or modifications in details of design or construction may be made without departing from the present invention.

The invention claimed is:

1. A method of fabricating a wafer level integration module according to a construction whereby semiconductor functional device fabrication is carried out only after interconnect structures are processed on a bare wafer, the fabrication and processing including forming the interconnect structures in a first side of the wafer; depositing a first insulation layer on the first side of the wafer; depositing a first conductive layer on the insulation layer, the first conductive layer filling the interconnect structures so as to contact the first insulation layer on the walls of the interconnect structures, the first conductive layer in the interconnect structures forming interconnection contacts on the first side of the wafer and interconnection vias in the wafer; exposing the first conductive layer including the interconnection contacts on the first side of the wafer; fabricating a semiconductor functional device on the first side of the wafer, the semiconductor functional device interconnected with the interconnection contacts during the fabricating the semiconductor functional device; exposing from the second side of the wafer, portions of the first conductive layer associated with the interconnection vias, the method comprising:

selectively removing a portion of the first conductive layer to form interconnection via redistribution connection structures; and filling the interconnection via redistribution connection structure with a low resistivity material to form low resistivity redistribution interconnect with the semiconductor functional device through the first conductive layer.

2. The method of claim 1 wherein:

the selectively removing the portion of the first conductive layer includes removing the first conductive layer up to the interconnection contacts such that the forming the interconnection via redistribution connection structures includes forming interconnection via voids; and the filling the interconnection via voids with a low resistivity material to form low resistivity interconnects with the semiconductor functional device.

3. The method of claim 1 wherein the conductive layer is a high temperature conductive film.

4. The method of claim 3 wherein the exposing the first conductive layer, including the high temperature conductive film includes exposing by chemical mechanical polishing.

5. The method of claim 3 wherein the exposing the first conductive layer, including the high temperature conductive film includes exposing by back grinding.

6. The method of claim 1 further comprising covering the first side of the wafer with a protection substrate so as to protect the semiconductor functional device.

7. The method of claim 1 further comprising depositing a second insulation layer on the second side of the wafer; patterning the second insulation layer and exposing the low resistivity redistribution interconnect; depositing a second conductive layer on the patterned second insulation layer for providing contact between the low resistivity redistribution interconnects and an external device.

8. The method of claim 1 wherein the fabricating the semiconductor functional devices comprises depositing additional layers for forming a new functional device.

9. The method of claim 8 wherein the additional layers form a plurality of the new functional devices.

10. The method of claim 8 wherein the additional layers are formed in a stack formation.

11. The method of claim 1 wherein the interconnect via structures, the semiconductor functional device, the first conductive layer filling the interconnect structures, interconnection contacts and interconnection vias are formed as one of a plurality of dies formed on the wafer.

12. The method of claim 11 further comprising separating the plurality of dies along separation zones.

13. The method of claim 8 wherein the functional device includes a transistor.

14. The method of claim 9 wherein the plurality of semiconductor functional devices include transistors.

15. The method of claim 1 further comprising testing the semiconductor functional device after fabrication.

16. The method of claim 15 wherein testing the semiconductor functional device comprises forming test pads on the first side of the wafer.

17. The method of claim 15 further comprising removing the test pads after testing and before fabrication of a subsequent semiconductor functional device.

18. The method of claim 1 further comprising depositing a third insulation layer to the first conductive layer when the first conductive layer is applied to the interconnect structures in a manner so as to partially fill the interconnect structures to control a resistance of the resulting interconnection vias to planarize and protect the first conductive layer on the first side of the wafer.

19. The method of claim 2 wherein the conductive layer is a high temperature conductive film.

* * * * *